United States Patent [19]

Lease

[11] Patent Number: 5,446,444
[45] Date of Patent: Aug. 29, 1995

[54] CAPACITIVE THRESHOLD DETECTOR TEST CIRCUIT

[75] Inventor: Benjamin N. Lease, Knoxville, Tenn.

[73] Assignee: Robertshaw Controls Company, Richmond, Va.

[21] Appl. No.: 169,340

[22] Filed: Dec. 17, 1993

[51] Int. Cl.[6] ............... G08B 29/00; G01R 31/02
[52] U.S. Cl. ..................... 340/514; 340/562; 340/596; 340/618; 340/620; 200/60; 324/72.5; 324/658; 324/664; 324/158.1; 73/304 C
[58] Field of Search ........... 340/514, 562, 595–597, 340/612, 618, 620; 73/304 C, 304 R; 324/158 P, 72.5, 72, 71.1, 658; 200/600

[56] References Cited

U.S. PATENT DOCUMENTS

| | | | |
|---|---|---|---|
| 3,811,051 | 5/1974 | Merrell | 307/118 |
| 4,224,606 | 9/1980 | Bartles | 340/514 |
| 4,449,405 | 5/1984 | Franz et al. | 73/304 C |
| 4,497,204 | 2/1985 | Kobayashi | 73/304 C |
| 4,515,015 | 5/1985 | Kuhlman | 73/304 C |
| 4,528,839 | 7/1985 | Blanchard et al. | 73/304 C |
| 4,555,941 | 12/1985 | Fathuer et al. | 73/304 C |
| 4,573,040 | 2/1986 | Maltby et al. | 340/612 |
| 4,676,100 | 6/1987 | Eichberger | 73/304 C |
| 4,684,931 | 8/1987 | Parks | 340/562 |
| 4,914,377 | 4/1990 | Russell | 73/304 C |
| 5,034,722 | 7/1991 | Premack | 340/562 |
| 5,121,632 | 6/1992 | Keeler et al. | 73/304 C |

*Primary Examiner*—Donnie L. Crosland
*Attorney, Agent, or Firm*—Watts, Hoffmann, Fisher & Heinke

[57] ABSTRACT

A test circuit for testing operation of a liquid level detector. The liquid level detector includes a probe that is placed at a test site. A control circuit monitors changes in capacitance of the probe due to changes in the liquid level at the test site. A test switch grounds an input to the probe which and causes the control circuit to sense an alarm condition. If the detector does not activate an alarm when the test switch is actuated, the detector is not properly functioning and repair or replacement of the level detector is needed.

8 Claims, 2 Drawing Sheets

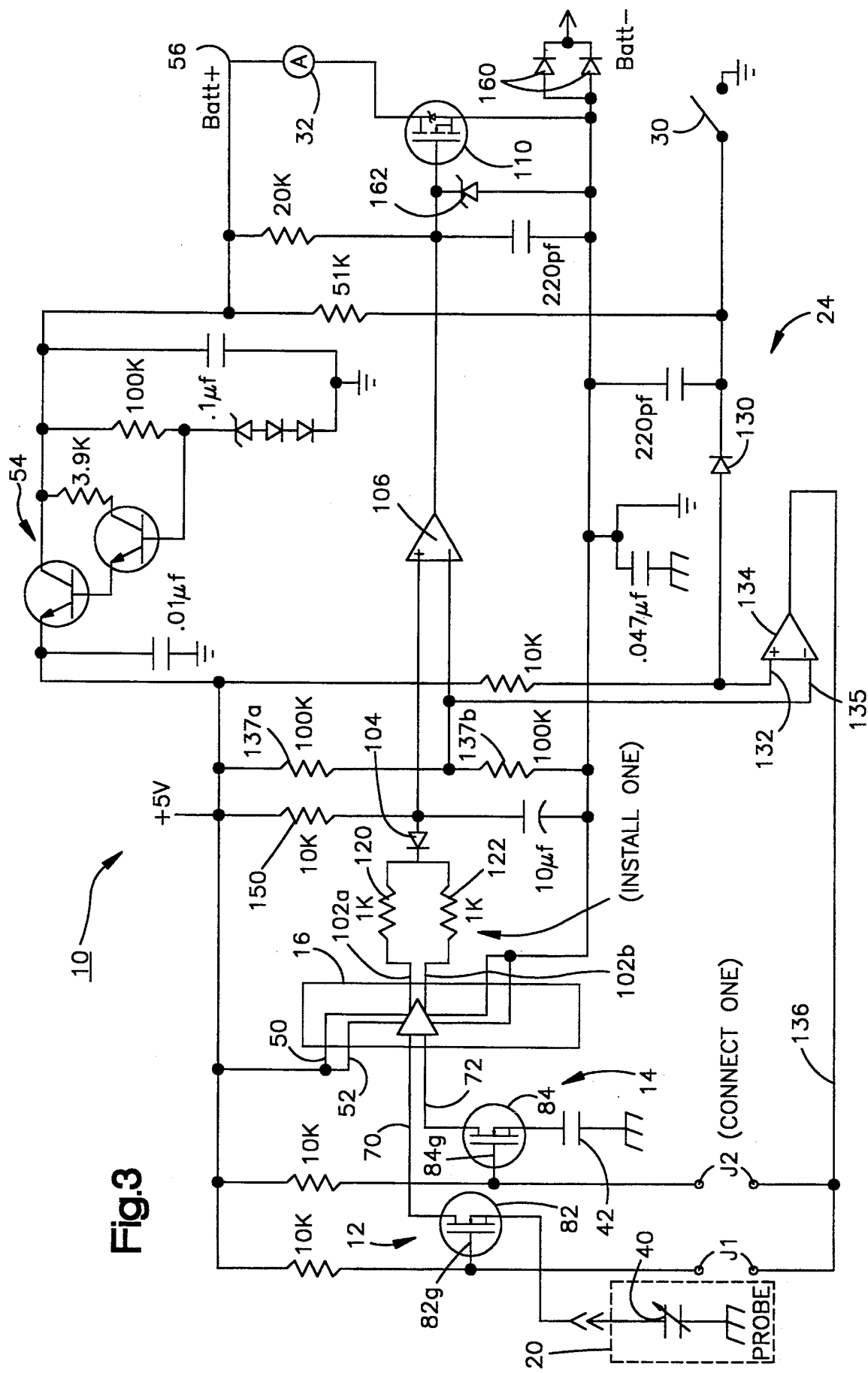

CAPACITIVE THRESHOLD DETECTOR TEST CIRCUIT

FIELD OF THE INVENTION

The present invention concerns a liquid level monitoring circuit and, more particularly, a test feature of the monitoring circuit that allows operation of the circuit to be confirmed.

BACKGROUND ART

Robertshaw Controls Co., assignee of the present invention, sells a liquid level sensor for detecting the presence or absence of a liquid and providing an output that activates an alarm. This prior art sensor is sold under the designation Mini-Tek 800. The Mini-Tek 800 sensor has a probe that determines a liquid level at a probe site by monitoring capacitance changes caused by changes in liquid level.

U.S. Pat. No. 4,224,606 discloses a fluid level control circuit having a test function. Pressing a test switch reduces voltage at an FET gate and takes the FET from a pinched-off condition allowing a drain capacitor to discharge through the FET. This drops a relay out of the circuit and closes an alarm contact to actuate an alarm.

U.S. Pat. No. 4,676,100 discloses a test circuit for simulating a "high" material level in an LC resonant frequency fluid level indicator. Closing a switch activates a second switch and adds three capacitors in parallel with the probe. The increased capacitance causes a threshold detector to indicate a "high" material level.

U.S. Pat. No. 5,121,632 discloses a sensor including a self-diagnostic routine which connects the probe to a comparator that compares the voltage on the probe to a supply voltage. Under normal conditions, the variable capacitance of the probe will charge up to a supply voltage. If the probe is shorted, then the variable capacitor will not charge up and cause the output of the comparator to be high to flag and error condition on a microprocessor controller.

The present invention concerns a test circuit for use in conjunction with a sensor such as the prior art Mini-Tek 800. A test input allows an operator to artificially simulate a condition which normally would cause the circuit to activate an alarm. By activating the test input, the circuit's operation can be confirmed.

DISCLOSURE OF THE INVENTION

The present invention includes a level detector that includes a first charging circuit having a probe that can be placed at a liquid detection site and that charges at a rate dependent upon the liquid level at the detection site. A second reference charging circuit conducts charge at a rate independent of the liquid level at the detection site. A control circuit compares the rate of charging of the first and second charging circuits and produces a detector output signal based upon the comparison. Under normal circumstances, this output activates an alarm calling attention to the fact that the liquid has reached a certain level at the detection site or alternately that no liquid is sensed at the detection site.

A test circuit inhibits one of the first and second charging circuits. This artificially produces an alarm output since the comparison conducted by the control circuit always results in a sensing of an alarm condition. In an instance in which the probe warns when liquid is sensed, the test circuit artificially causes the control circuit to sense liquid.

The preferred charging circuits include a switch coupled to the control circuit which normally conducts when activated by the control circuit. The test input inhibits the switch so that the control circuit senses a condition which normally would cause an alarm. When a user manually activates the test input to the detector, an alarm should result and if it does not, the detector is not working properly.

The preferred detector includes field effect transistors in both the first and second charging circuits. The field effect transistors are normally biased in saturation, allowing normal charging of both the first and second circuits. A gate electrode to one of the field effect transistors is selectively grounded by the test input. When this occurs, the field effect transistor no longer charges at its normal rate. Since the second circuit continues to charge at its normal rate, the control circuit detects an alarm condition and produces an alarm output.

In accordance with the preferred design, the control circuit causes the first and second charging circuits to conduct at regular intervals. Within a short time of actuation of the test input, the detector should produce an output to activate an alarm and confirm normal detector operation.

From the above, it is apparent that one object of the invention is a detector for monitoring liquid levels having a test feature to enable a user to confirm operation of the detector. This and other objects, advantages and features of the invention will become better understood from a detailed description of a preferred embodiment of the invention which is described in conjunction with the accompanying drawings.

BRIEF DESCRIPTION OF THE DRAWINGS

FIG. 3 is a schematic showing a circuit constructed in accordance with the invention coupled to a probe at a liquid level test site;

BEST MODE FOR PRACTICING THE INVENTION

Figure 1:
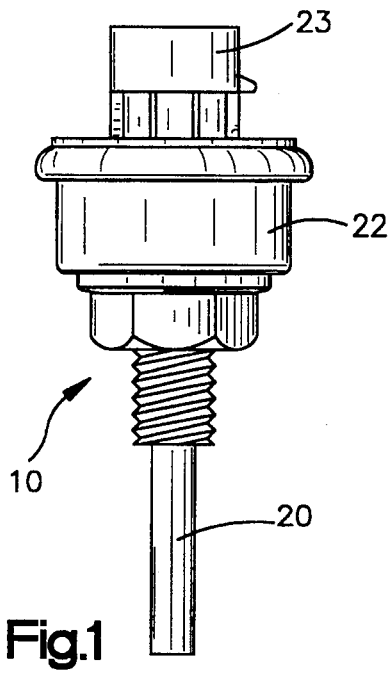
FIGS. 1 and 2 are elevation views of two level sensors having test inputs for confirming operation of the sensors.

The drawings illustrate a level detector 10 that includes first and second charging circuits 12, 14 (FIG. 3) coupled to a control circuit 16 for monitoring the presence or absence of fluid at a detection site. The first charging circuit 12 includes an elongated probe 20 that extends away from a base 22 (FIG. 1) that encloses the charging circuits 12, 14 and control circuit 16. Electrical signals are routed into and out of the base 22 by a four pin connector 23 at the top of the base. Pin contacts are not visible but are contained within a cavity in the connector 23.

Operation of the first charging circuit 12 is modified by a test circuit 24 coupled to one of the two charging circuits 12, 14. The test circuit 24 includes a user-actuable switch 30 for allowing the user to test performance of the detector and specifically, actuate a visual alarm 32 coupled to the control circuit. The control circuit 16 includes circuitry for periodically activating the two charging circuit 12, 14. Charge from the control circuit 16 builds up on capacitors 40, 42 causing voltages on the capacitors to increase at a rate dependent upon the capacitance of the capacitors 40, 42. A charging current is most preferably developed within the control circuit 16 which, in accordance with the preferred embodiment of the present invention, is constructed using an ASIC (application specific integrated circuit). By determining which one of the first and second charging circuits 12, 14 charges more quickly, the control circuit 16 can determine an absence of or presence of liquid in contact with the probe 20.

Referring to the FIG. 3 schematic, it is seen that two inputs 50, 52 to the control circuit 16 are coupled to a power supply voltage of five volts. The five-volt signal is maintained by a regulator circuit 54 coupled to a power input 56 which typically falls in a range of from 9-32 volts d.c. One use of the invention is for monitoring fluid levels in a motor vehicle and the input 56 in this application is battery voltage.

Figure 4:
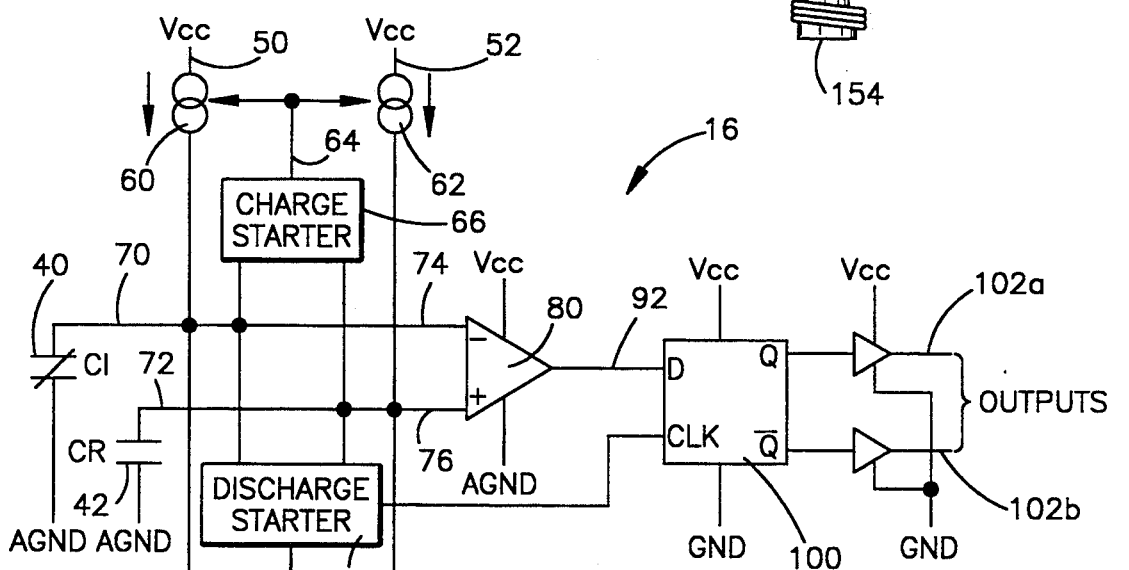
FIG. 4 is a schematic showing a control circuit for charging first and second charging circuits with constant current and monitoring a voltage signal produced by this charging.

The five-volt signal at the inputs 50, 52 is coupled to two constant current sources 60, 62 (FIG. 4) having control gates coupled to a control output 64 from a starter circuit 66. One constant current source 60 is coupled to an output 70 to the first charging circuit 12 and a second constant current source 62 coupled to an output 72 to the second charging circuit 14. Upon actuation by the starter circuit 66, the current sources 60, 62 charge the two capacitors 40, 42 with a constant current. The voltage build-up on these two capacitors, however, depends upon their capacitance so that the voltage at two inputs 74, 76 to an operational amplifier 80 in the control circuit 16 increases at different rates.

The lower the capacitance, the faster the charging occurs so that the capacitor with the lower capacitance increases in voltage at the higher rate.

As seen in FIG. 3, current from the control circuit 16 charges the capacitors 40, 42 through two field effect transistors 82, 84. During normal level sensing, these field effect transistors 82, 84 have their gates 82g, 84g pulled up to the five-volt power supply signal coupled to the control circuit inputs 50, 52. This biases the FETs into saturation, allowing charging current from the control circuit 16 to flow through the FETs 82, 84 with a minimal voltage drop to an associated one of the two capacitors 40, 42.

The current sources 60, 62 charge the charging circuits 70, 72 until the charge on one of the capacitors 40, 42 reaches a two-volt threshold, after which a discharge circuit 90 discharges them to ground. A cycle of capacitor charging and discharging is maintained at a typical rate of 200 KHz so long as a voltage input 56 is applied to the level detector. The charge/discharge cycle rate is a function of the smaller capacitance of the two charging circuits 70, 72.

Theory of Operation

The detector 10 depicted in FIG. 1 is constructed for monitoring the presence or absence of a conductive liquid. Detection of liquid level is accomplished by relating the level of liquid on the probe 20 to a change in capacitance of the probe. This can be theoretically evaluated by analogyzing to a parallel plate capacitor in which one plate of the capacitor increases in size while the second plate and the dielectric layer between plates remains a constant. As the length of the probe 20 is emersed within the liquid changes, the plate size of the theoretical capacitor increases and decreases. When the probe 20 is fully emersed in liquid, the capacitance reaches a maximum and accordingly, the capacitor 40 charges less quickly. Thus, in a situation in which the control circuit 16 monitors the absence of a liquid, as the amount of liquid overlap on the probe 20 decreases, the capacitance of the probe decreases so the time it takes the capacitor 40 to charge increases. The capacitor 42 is a fixed value and does not change with liquid level. It is used as a reference to compare the rate of charging of the capacitor 40.

Level Sensing

The control circuit 16 senses voltages at the two connections 70, 72 by means of the operational amplifier 80. The operational amplifier 80 is configured as a differential amplifier so that an output 92 will be high if the signal at the input 76 is greater than the input 74 and low otherwise. The output 90 from the amplifier 80 is clocked into a latch 100 by the discharge circuit 90 at the end of every charge cycle. Outputs from the comparator 80 are transferred through the latch circuit 100 to two complementary outputs 102a, 102b external to the control circuit 16. A low signal from one of the outputs to a diode 104 will forward bias the diode 104 pulling a non-inverting input to a comparator 106 (FIG. 3) low. This produces a low output from the comparator 106. The comparator output is coupled to a gate input of an N channel MOSFET 110. A low gate signal turns off the MOSFET 110 and de-activates the alarm 32. A high signal from one of the outputs 102a, 102b will reverse bias the diode 104, allowing the non-inverting input of the comparator 106 to pull high. This produces a high output from the comparator 106, turning the MOSFET 110 on, activating the alarm 32.

With the probe fully emersed in liquid, the capacitor 40 has a greater capacitance than the capacitor 42 and the voltage on the capacitor 42 increases faster than the voltage on the capacitor 40. Referring again to the schematic of the control circuit 16, this causes the voltage at the input 76 to be greater than the input 74 when the discharge circuit 90 clocks the output from the amplifier 80 into the latch 100. When this occurs, an output from the comparator 80 coupled to the latch 100 produces a high output signal which is maintained until a next subsequent clock input resets the latch 100.

Figure 2:
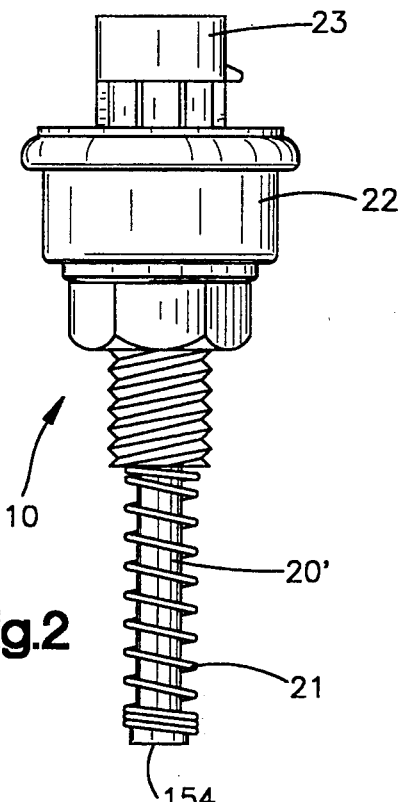

The same control circuit 16 can be used for monitoring the presence or absence of a non-conductive liquid. In this embodiment, the probe 20' (FIG. 2) is surrounded by a conductive spiral coil 21 which forms a second plate of a capacitor 40. As liquid level increases, the liquid fills the gap between the spiral coil 21 and the probe 20'. This increases the capacitance which in turn slows the charging rate of the capacitor 40. The rest of the circuit performs the same function as described above in relation to the conductive liquid level sensing embodiment of FIG. 1.

Two resistors 120, 122 are shown coupled between the outputs 102a, 102b and the diode 104. For a given level detector, only one of these resistors is installed. If the detector 10 is configured to activate the alarm 32 when a high liquid level is used to activate the alarm (the probe is covered), a first resistor 120 is installed.

The resistor 122 is installed when the detector is used to activate an alarm when an absence of liquid is sensed.

Test Circuit 24

To test operation of the level detector 10, the user actuates a switch 30 to ground an input to the circuit shown in FIG. 3. Closing the switch causes a diode 130 to conduct and pulls a non-inverting input 132 to a comparator 134 low. The inverting input 135 to the comparator 134 is held at a reference voltage of 2.5 volts by a voltage divider formed by two resistors 137a, 137b that also biases the inverting input to the comparator 106. When the input 132 drops below the inverting input 135, an output 136 from the comparator amplifier 134 also goes low and modifies operation of one of the first and second charging circuit 12, 14.

The FIG. 3 circuit includes two possible jumper conductors J1, J2, only one of which is installed. With the jumper J1 installed, the level detector 10 activates the alarm if no liquid is sensed and with the jumper J2 installed, the level detector 10 activates the alarm if liquid is sensed.

Figures 5, 6:
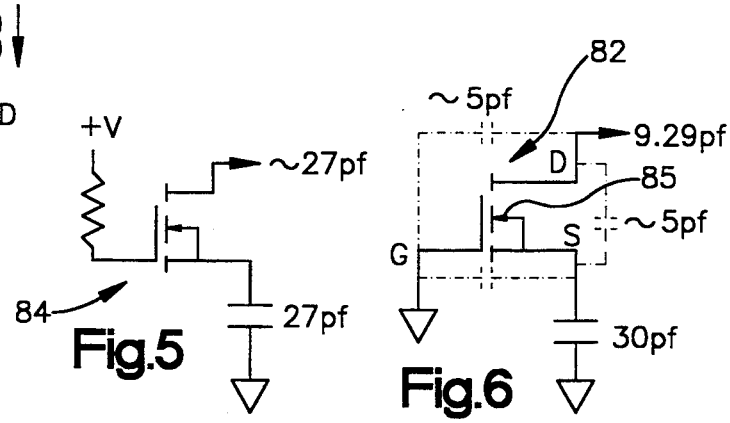
FIG. 5 is a portion of a probe-charging circuit showing an FET having a gate coupled to a voltage source through a resistor.
FIG. 6 is a portion of the probe-charging circuit depicted in FIG. 5 with the gate input grounded to initiate a test of the level sensor.

With the jumper J1 installed, a grounding of the test input 30 modifies the conductive state of the field effect transistor 82. To illustrate the consequences of this modification refer to FIGS. 5 and 6 of the drawings where the field effect transistors 82, 84 are depicted in two different configurations. In FIG. 5, the field effect transistor 84 has a gate input 84g coupled to the five-volt signal supplied by the voltage regulator 54. This biases the field effect transistor 84 into saturation, allowing the charging current to flow through the channel with a minimum IR voltage drop to charge the capacitor. The voltage as seen by the controller is essentially the voltage that would appear at the capacitor itself, i.e., 27 pico-farods. During discharge, the capacitor is discharged through the normally reverse biased diode 85 to about 0.7 volts.

In FIG. 6, the gate input to the field effect transistor 82 has been grounded by a low output from the amplifier 134. This biases the field effect transistor 82 into sub-threshold and produces a characteristic capacitance equal to the parallel combination of the gate/drain capacitance and the series combination of the drain/source capacitance and source/gate capacitance. Typical values of these capacitances for a grounded gate input result in a value of approximately 10 pico-farads so that now the capacitance as seen by the constant current source inside the controller 16 is significantly less than the nominal capacitance on the capacitor 42.

A MOSFET in an "off" or sub-threshold condition is characterized by an output capacitance (Coss), an input capacitance (Ciss), and reverse transfer capacitance (Crss). Coss is defined as the capacitance between the drain and the source, plus the capacitance between the gate and the drain (Coss=Cds+Cgd). Ciss is defined as the capacitance between the gate and the source, plus the capacitance between the gate and the drain (Ciss=Cgs+Cgd). Crss is defined as the capacitance between the gate and the drain (Crss=Cgd).

FIG. 6 depicts the active test function, and its effect on the total capacitance. The capacitor (Reference, or Unknown) will be effected by a series capacitance, Coss-Crss. This value, for purpose of example, may be 5 pF. In parallel with this capacitive stack is another capacitance, Crss. This value, for purpose of example, may be 5 pF. The total capacitance in this example would be approximately 9.29 pF, much lower than the compared capacitor, 27 pF. This change in capacitance will "fool" the ASIC into changing output states and activating the alarm 32.

As one specific example of operation of the invention, consider a circumstance in which the alarm 32 is activated if the level detector 10 does not sense liquid in contact with the probe 20 of FIG. 1. In this example, a 1000-ohm resistor 122 (but no resistor 120) is installed in the FIG. 3 circuit between the output 102b and the diode 104. To test the circuit, grounding of the test input must cause the control circuit to sense a low liquid level corresponding to a low capacitance. This requires the jumper J1 (FIG. 3) to be installed. The normal (non-test) state with the probe immersed in liquid means the capacitance 40 is greater than the capacitance 42. When the discharge circuit 90 clocks the resulting high signal at the output 92, the output 102b stays low and the alarm is not activated. To test the circuit, the switch 30 is closed to ground the input 132. This causes the input at the gate 82g to be grounded, fooling the control circuit 16 so that when the discharge 90 clocks the low input to the latch 100, the output 102b goes high to activate the alarm 32.

The non-inverting input (+) to the comparator 106 is normally held at a five-volt signal by a pull-up resistor 150 unless the control circuit 16 pulls that input to ground. By using a large resistor of 1.47 Megohm for the pull-up resistor 150, a time delay of 10 seconds results before the alarm responds to the level detector 10. The delay can be used to avoid false triggering of the alarm due to "sloshing" of a liquid in a container. Such a condition may be transitory and use of a delay requires the level detector 10 to repeated sense the condition before activating the alarm.

The two probes 20, 20' are elongated brass rods that extend beneath threaded portions 152 of the level detector 10. The probe 20 is coated with a layer of dielectric material which forms the dielectric of the capacitor 40. Preferably this coating is a layer of Teflon based dielectric sold under the name Tefzel-200 sold by Dupont or a liquid crystal based material named Vectra A 430 sold by Hoechst-Celanese. The probe 20' is electroplated but not covered with a dielectric since the fluid in which the probe 20' is emersed acts as the dielectric. A plastic end cap 154 slips over the end of the probe 20' and fits inside the coil 21 to center the probe 20' within the coil 21.

In an alternate embodiment of the invention, one side of the alarm 32 is grounded and the FET 110 is connected to a positive side of the alarm. In this embodiment, a drain electrode of the FET 110 is connected to the positive input to the circuit by parallel diodes 160 which, in the disclosed embodiment, connect the FET source to the negative battery terminal. Also, in such an alternate embodiment a zener diode 162 is connected between the positive battery terminal and the FET's gate electrode.

The present invention has been described with a degree of particularity, but it is the intent that the invention include all modifications and alterations from the disclosed design falling within the spirit or scope of the appended claims.

I claim:
1. A level detector comprising:
a) a first charging circuit having a probe that can be placed at a liquid detection site for conducting charge at a rate based on the level of liquid at the liquid detection site;

b) a second charging circuit for conducting charge at a rate independent of the liquid level at the detection site;

c) control circuitry coupled to the first and second charging circuits for periodically activating said first and second charging circuits and for comparing the rates of charging of the first and second charging circuits and producing a detector output signal based upon the comparison; and d) a test input for inhibiting one of said first and second charging circuits and thereby controlling the detector output signal to test the functioning of the level detector.

2. The detector of claim 1 wherein the first and second charging circuits comprise switches for conducting charge supplied by a current source and wherein the test input adjusts a conductive state of the switch means of one of said first and second charging circuits.

3. The detector of claim 2 wherein the control circuitry comprises a regulated current source coupled to the switches of said first and second charging circuits.

4. The level detector of claim 1 wherein the first and second charging circuits comprise first and second field effect transistors and further comprising a switch for modifying operation one of said field effect transistors.

5. A method for monitoring presence of a liquid at a test site with a sensor, the method comprising the steps of:

a) placing a first charging circuit at the test site which charges at a rate depending on a sensed liquid level at the test site;

b) providing a second charging circuit that charges at a reference rate independent of the sensed liquid level at the test site;

c) periodically causing the first and second charging circuits to charge, comparing the rates of charging of the first and second charging circuits, and providing an output indication based upon the comparing of the rates of charging;

d) performing a test of the sensor by inhibiting one of said first and second charging circuits; and d) comparing the rates of charging of the first and second charging circuits after the inhibiting step and producing an output indication based upon the comparison to confirm proper operation of the sensor.

6. The method of claim 5 where each of the first and second charging circuits includes a field effect transistor that transmits charge at a rate dependent on a capacitance coupled to the field effect transistor and wherein the step of inhibiting one of the charging circuits comprises the step of disabling one of said field effect transistors.

7. The method of claim 6 wherein the step of disabling a field effect transistor is performed by grounding an input gate of to the field effect transistor.

8. A level detector comprising:

a) a first charging circuit including a probe that can be placed at a liquid detection site and a first gate controllable charge conducting circuit component for conducting charge at a rate based on the level of liquid at the liquid detection site;

b) a second charging circuit including a second gate controllable charge conducting circuit component for conducting charge at a rate independent of the liquid level at the detection site;

c) control circuitry coupled to the first and second charging circuits for periodically supplying charging current to said first and second charging circuits and for comparing the rate of charging of the first and second charging circuits to provide a detector output signal based upon the comparison; and d) a test input for inhibiting one of said first and second charging circuits by applying a control voltage to one of said first and second gate controllable circuit components to test the functioning of the level detector.

* * * * *